(12) United States Patent
Kraus et al.

(10) Patent No.: US 10,550,466 B2
(45) Date of Patent: Feb. 4, 2020

(54) DEVICE FOR INSULATING AND SEALING ELECTRODE HOLDERS IN CVD REACTORS

(71) Applicant: Wacker Chemie AG, Munich (DE)

(72) Inventors: Heinz Kraus, Zeilarn (DE); Christian Kutza, Ampfing (DE); Dominik Rennschmid, Burghausen (DE)

(73) Assignee: WACKER CHEMIE AG, Munich (DE)

( * ) Notice: Subject to any disclaimer, the term of this patent is extended or adjusted under 35 U.S.C. 154(b) by 247 days.

(21) Appl. No.: 15/526,131

(22) PCT Filed: Nov. 6, 2015

(86) PCT No.: PCT/EP2015/075933
§ 371 (c)(1),
(2) Date: May 11, 2017

(87) PCT Pub. No.: WO2016/078938
PCT Pub. Date: May 26, 2016

(65) Prior Publication Data
US 2017/0306477 A1  Oct. 26, 2017

(30) Foreign Application Priority Data
Nov. 17, 2014  (DE) .................... 10 2014 223 415

(51) Int. Cl.
*C23C 16/24* (2006.01)
*C01B 33/035* (2006.01)
*C23C 16/44* (2006.01)
*C23C 16/46* (2006.01)

(52) U.S. Cl.
CPC ............ *C23C 16/24* (2013.01); *C01B 33/035* (2013.01); *C23C 16/4418* (2013.01); *C23C 16/46* (2013.01)

(58) Field of Classification Search
CPC ....................................................... C23C 16/24
See application file for complete search history.

(56) References Cited

U.S. PATENT DOCUMENTS

| | | | |
|---|---|---|---|
| 2009/0252599 A1* | 10/2009 | Cavagnaro | ............ F02B 37/013 |
| | | | 415/119 |
| 2010/0058988 A1 | 3/2010 | Endoh et al. | |
| 2010/0212592 A1* | 8/2010 | Li | ........................ C23C 16/4409 |
| | | | 118/723 R |
| 2011/0305604 A1 | 12/2011 | Stoecklinger | |
| 2013/0011581 A1 | 1/2013 | Mueller et al. | |
| 2017/0222388 A1* | 8/2017 | Ma | ............................. H01S 3/02 |

FOREIGN PATENT DOCUMENTS

| | | |
|---|---|---|
| CN | 101565184 A | 10/2009 |
| CN | 201424378 Y | 3/2010 |
| CN | 202193621 U | 4/2012 |
| CN | 102616783 A | 8/2012 |
| EP | 2 161 241 A2 | 3/2010 |
| WO | 2011/092276 A1 | 8/2011 |
| WO | 2011/116990 A1 | 9/2011 |
| WO | 2014/143910 A1 | 9/2014 |

* cited by examiner

*Primary Examiner* — Elizabeth A Burkhart
(74) *Attorney, Agent, or Firm* — Brooks Kushman P.C.

(57) ABSTRACT

Siemens CVD reactors are sealed in a manner which facilitates long production campaigns without refurbishing the seals, by the use of at least two seals, and an electrically insulating member having a thermal conductivity of from 1 to 200 W/mK, a sustained use temperature of at least 400° C., and a resistivity of more than $1 \cdot 10^9$ Ωcm.

16 Claims, 7 Drawing Sheets

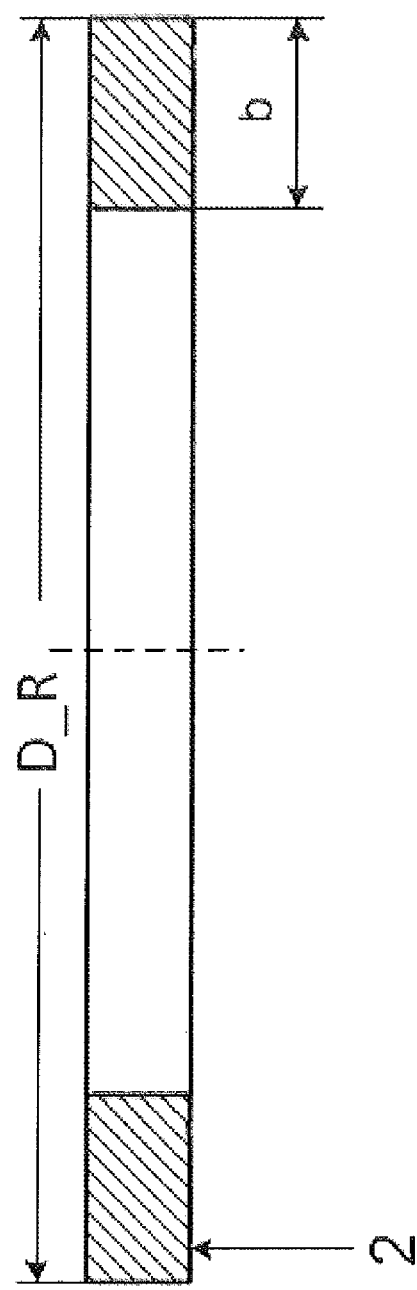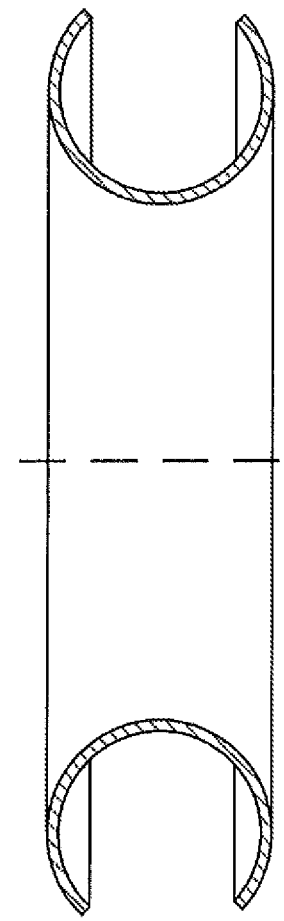
Fig. 5
Fig. 6

DEVICE FOR INSULATING AND SEALING ELECTRODE HOLDERS IN CVD REACTORS

CROSS REFERENCE TO RELATED APPLICATIONS

This application is the U.S. National Phase of PCT Appln. No. PCT/EP2015/075933 filed Nov. 6, 2015, which claims priority to German Application No. 10 2014 223 415.8 filed Nov. 17, 2014, the disclosures of which are incorporated in their entirety by reference herein.

BACKGROUND OF THE INVENTION

1. Field of the Invention

The invention relates to a device for insulating and sealing electrode holders in a reactor for depositing polycrystalline silicon and to a process for producing polycrystalline silicon using such a device.

2. Description of the Related Art

High-purity silicon is generally produced by the Siemens process. This comprises introducing a reaction gas comprising hydrogen and one or more silicon-containing components into the reactor fitted with support bodies heated by direct passage of current upon which solid silicon is deposited. Preferably employed silicon-containing compounds are silane ($SiH_4$), monochlorosilane ($SiH_3Cl$), dichlorosilane ($SiH_2Cl_2$), trichlorosilane ($SiHCl_3$), tetrachlorosilane ($SiCl_4$) and mixtures thereof.

Each support body is generally composed of two thin filament rods and one bridge which generally connects adjacent rods at their free ends. The filament rods are most commonly fabricated from mono- or polycrystalline silicon, metals/alloys or carbon being employed more rarely. The filament rods are slotted vertically into electrodes disposed on the reactor floor which provide the connection to the electrode holder and current supply. High-purity polysilicon is deposited on the heated filament rods and the horizontal bridge to increase the diameter thereof over time. The process is terminated once the desired diameter has been achieved.

The silicon rods are held in the CVD reactor by special electrodes generally made of graphite. In each case two filament rods having different voltage polarities at the electrode holders are connected by a bridge at the other slim rod end to form a closed electrical circuit. Electrical energy for heating the slim rods is supplied via the electrodes and their electrode holders. This causes the diameter of the slim rods to increase. The electrode simultaneously grows into the rod base of the silicon rods, starting at its tip. Once a desired target diameter for the silicon rods has been achieved the deposition process is terminated and the silicon rods are cooled and removed.

The sealing of the electrode holder which passes through the floor plate is of particular importance. The use of electrode sealing bodies has been proposed to this end, importance attaching in particular to the arrangement and shape of the electrode sealing body and the material employed.

Disposed between the top of the electrode holder, which protrudes into the deposition equipment, and the floor plate is an annular body. this body typically has two functions: 1) sealing of the electrode holder feedthrough, and 2) electrical insulation of the electrode holder from the floor plate.

The high gas-space temperature in the CVD reactor necessitates thermal protection of a hydrocarbon-based sealing body. Insufficient thermal protection results in premature wear of the sealing bodies due to scorching of the sealing bodies, thermally induced flow of the sealing body, reactor leaks, the distance between electrode holder and floor plate falling below the minimum value, and ground faults at charred sealing bodies. Ground faults or leaks result in outage of the deposition equipment and hence in the deposition process being aborted. This results in a lower yield and higher costs.

US 20110305604 A1 discloses shielding the electrode seals from thermal stress using protective rings made of quartz. The reactor floor has a special configuration. The reactor floor comprises a first region and a second region. The first region is formed by a plate facing toward the interior of the reactor and an intermediate plate carrying the nozzles. The second region of the reactor floor is formed by the intermediate plate and a floor plate carrying the supply connections for the filaments. The cooling water is fed into the first region thus formed in order thus to cool the reactor bottom. The filaments themselves are seated in a graphite adapter. This graphite adapter engages with a graphite clamping ring, which itself interacts with the plate via a quartz ring. The cooling water connections for the filaments may be in the form of quick-fit couplings.

WO 2011116990 A1 describes an electrode holder having a quartz cover ring. The process chamber unit is composed of a contacting and clamping unit, a base element, a quartz covering disk, and a quartz covering ring. The contact and clamping unit is composed of a plurality of contacting elements which can be moved relative to one another and form a receiving space for a silicon slim rod. The contacting and clamping unit may be introduced into a corresponding receiving space of the base element, the receiving space for the silicon slim rod narrowing on introduction into the base element so that said slim rod is thus securely clamped and electrically contacted. The base element also comprises a lower receiving space for receiving a contacting tip of the feedthrough unit. The quartz covering disk has central openings for feeding through the contacting tip of the feedthrough unit. The quartz covering ring has dimensions such that it can at least partially radially surround a region of the feedthrough unit disposed inside a process chamber of a CVD-reactor.

However, since the quartz, used as described in the relevant art, has a low thermal conductivity, these components become so hot under deposition conditions that a thin silicon layer grows on their surface at high temperature. The silicon layer is electrically conducting under these conditions which leads to a ground fault.

WO 2011092276 A1 describes an electrode holder where the sealing element between the electrode holder and the floor plate is protected against the effects of temperature by a circumferential ceramic ring. A plurality of electrodes are secured in a floor of the reactor. These electrodes carry filament rods seated in an electrode body which supplies current to the electrodes/filament rods. The electrode body itself is mechanically prestressed in the direction of the top face of the floor of the reactor by a plurality of resilient elements. A radially circumferential sealing element is inserted between the top face of the floor of the reactor and a ring of the electrode body which is parallel to the top face of the floor. The sealing element itself is shielded by a ceramic ring in the region between the top face of the floor of the reactor and the ring of the electrode body which is parallel thereto.

The sealing element is made of PTFE and assumes both the sealing function and the insulating function. The ceramic ring serves as a heat shield for the sealing ring. However, subjecting PTFE to thermal stress above 250° C. results in scorching/cracking at the seal surface and flow of the sealing body. The distance between the top of the electrode holder and the floor plate thus falls below a minimum value leading to electrical arcing/ground faults from the electrode holder to the floor plate. The scorching/cracking also releases carbon compounds which lead to contamination of the silicon rods to be deposited due to incorporation of carbon.

US 20130011581 A1 discloses a device for protecting electrode holders in CVD reactors which comprises an electrode which is suitable for accommodating a filament rod and is disposed on an electrode holder made of an electrically conductive material and mounted in a recess in a floor plate, wherein an intermediate space between the electrode holder and the floor plate is sealed with a sealing material and the sealing material is protected by a protective body constructed from one or more parts and arranged in a ring shape around the electrodes, wherein the height of the protective body increases at least in sections in the direction of the electrode holder. This document provides for geometrical bodies arranged concentrically around the electrode holder, their height decreasing with an increasing distance from the electrode holder. The body may also be composed of one part. This provides for thermal protection for the sealing and insulating body of the electrode holder and also for flow modification at the rod base of the deposited polysilicon rods which has a positive influence on the fallover rate.

The devices according to WO 2011092276 A1 and according to US 20130011581 A1 can suffer from ground faults between the electrode holder and the floor plate due to silicon slivers which, on account of thermal stresses due to the high feed rate, spall off the silicon rods, fall between the electrode holder and the ceramic ring/support body and there produce an electrically conducting connection between the electrode holder and the floor plate. Short circuits entail abrupt process termination due to outage of the current supply for heating the rods. The rods cannot be deposited up to the intended end diameter. Thinner rods lead to lower plant capacity which results in considerable costs.

CN 202193621 U discloses a device providing two ceramic rings between the top of the electrode holder and the floor plate with a graphite gasket disposed between them. However, this device provides no sealing function between the ceramic ring and the top of the electrode holder nor between the ceramic ring and the floor plate. The reactor consequently suffers from leaks.

CN 101565184 A discloses an insulating ring made of zirconium oxide ceramic material ($ZrO_2$) between the top of the electrode holder and the floor plate. The insulating ring is recessed in the floor plate. An additional quartz ring is therefore required for insulation between the top of the electrode holder and the floor plate. Sealing is achieved via two graphite gaskets between the top of the electrode holder and the insulating ring and between the floor plate and the insulating ring. An O-ring is employed at the electrode feedthrough below the floor plate as a further seal.

CN 102616783 A discloses an insulating ring made of ceramic material between the top of the electrode holder and the floor plate. Sealing is achieved via two metal framed graphite gaskets above and below the insulating ring toward the top of the electrode holder and toward the floor plate respectively.

The problem with the latter two documents is that the graphite gasket requires high contact pressures to achieve sealing. Since ceramics material is brittle and has a low flexural strength, the sealing surfaces of the floor plate and the top of the electrode holder are subject to strict evenness requirements. Even the slightest unevenness, which is almost unavoidable in practice, results in fracture of the ceramic rings due to the high contact pressures. The reactor consequently suffers leaks.

WO 2014/143910 A1 discloses a sealing ring between the floor plate and the electrode holder comprising a base body made of a ceramic material with an upper and a lower groove, wherein sealing elements are inserted into the respective grooves. However it has become apparent that the sealing elements inserted into the grooves in the ceramic ring are subjected to a high level of thermal stress. Dynamic temperature changes at the sealing elements may lead to movement at the sealing elements caused by thermal expansion/contraction of the electrode holder, floor plate and seal. This can damage the surfaces of the sealing elements which may lead to leaks at the seals. This makes frequent seal replacement necessary resulting in reduced reactor service time.

US 2010058988 A1 provides for securing the electrode holder in the floor plate via a conical PTFE sealing and insulating element. The top face of the conical PTFE sealing element is compressed against the electrode holder via a flange (cross-sectional widening). An O-ring is additionally provided both between the sealing element and the electrode feedthrough through the floor plate and between the sealing element and the shaft of the electrode holder.

The compression of the conical sealing element impedes removal of the electrode holder. Flow of the PTFE sealing body can result in the distance between the electrode holder and the floor plate falling below the minimum value. This results in electrical arcing/ground faults.

SUMMARY OF THE INVENTION

It was an object of the invention to solve the problems previously described. This and other objects are achieved by a device for insulating and sealing electrode holders in CVD reactors which comprises an electrode which is suitable for accommodating a filament rod and is disposed on an electrode holder made of an electrically conductive material and mounted in a recess in a floor plate, wherein provided between the electrode holder and the floor plate is an electrically insulating ring made of a material of construction having a specific thermal conductivity at room temperature of 1-200 W/mK, a sustained use temperature of no less than 400° C. and a specific electrical resistance at room temperature of more than $10^9$ Ωcm, wherein at least two ring-shaped sealing elements for sealing between the electrode holder and the floor plate are provided, wherein the electrically insulating ring or the electrode holder or the floor plate comprises grooves in which the sealing elements are secured, wherein at least one of the sealing elements is secured in a groove disposed in the electrode holder or in the floor plate and arranged above or below the electrically insulating ring.

A further object of the invention is directed to a process for producing polycrystalline silicon, comprising introducing a reaction gas comprising a silicon-comprising component and hydrogen into a CVD reactor comprising at least one filament rod which is disposed on a device according to the invention or on a device according to one of the preferred embodiments and which is supplied with current via the electrode and which is thus heated by direct passage of current to a temperature at which polycrystalline silicon is deposited on the filament rod.

BRIEF DESCRIPTION OF THE FIGURES

FIG. 5 shows a schematic diagram of an insulating ring without a groove.

FIG. 6 shows a cross-section through a metal C-ring.

DETAILED DESCRIPTION OF THE PREFERRED EMBODIMENTS

Figure 1:
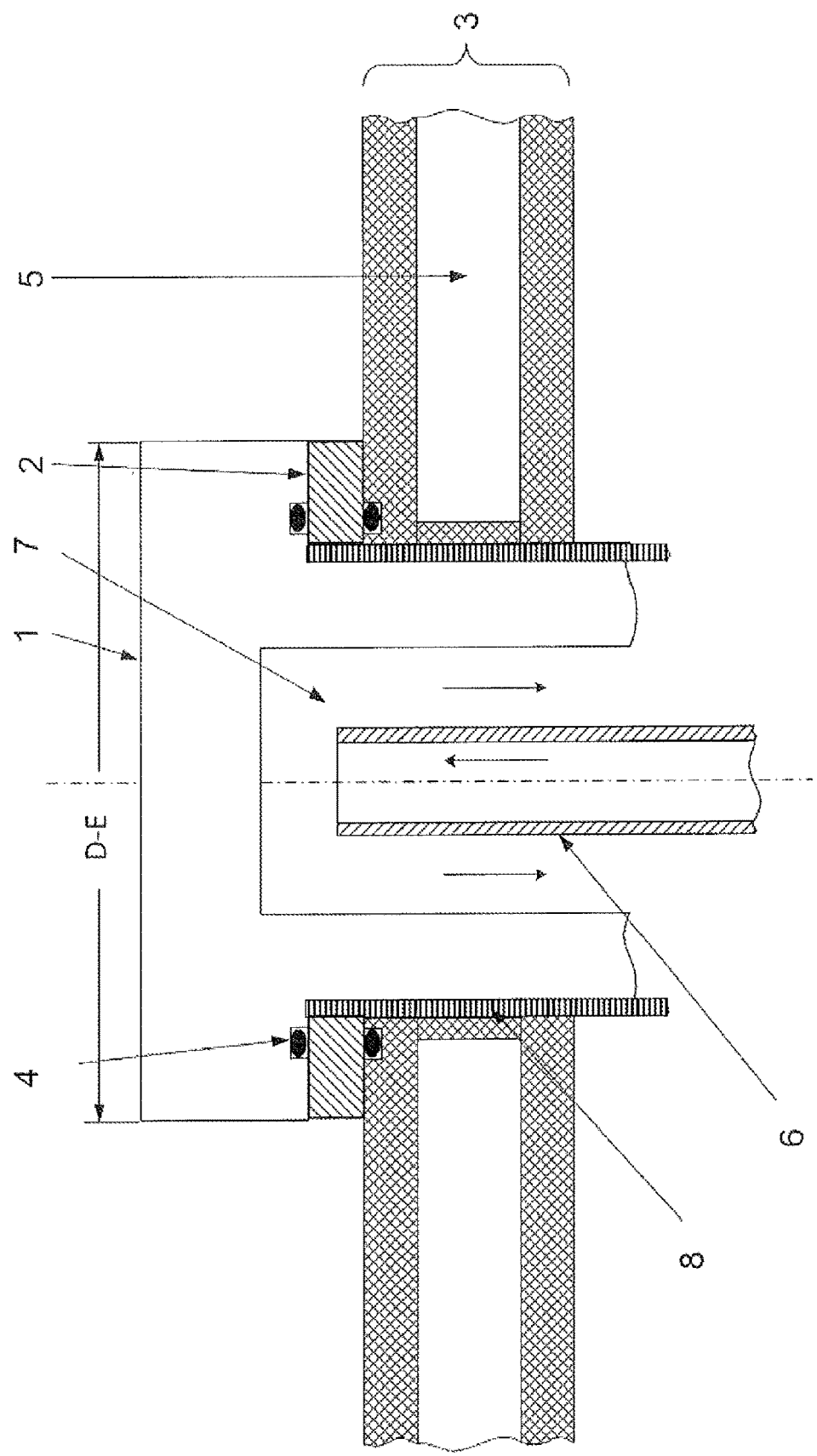
FIG. 1 shows a schematic diagram of a fitted insulating ring and an upper groove with a sealing element in the electrode holder and a lower groove with a sealing element in the floor plate.

Preferred embodiments of the invention are discernible from the accompanying claims and the description which follows.

The invention provides for separating the sealing body and the insulating body, i.e. dividing sealing and insulating functions over two components, an insulating ring being provided for electrical insulation and a sealing part being provided for sealing.

This makes it possible to choose for the insulating ring and the sealing part different materials of construction that are better suited for the respective functions of the two components.

The insulating ring should be high temperature resistant and dimensionally stable while a sealing function is not necessary. The higher dimensional stability allows insulating rings of greater height to be employed. The greater distance between the electrode holder and the floor plate permits application of greater electrical voltage. The advantage of this is that a plurality of rod pairs may be connected in series thus allowing savings to be made on capital expenditure on the reactor current supply.

The advantage of positioning the sealing elements in a groove in the electrode holder and/or in a groove in the floor plate is that the sealing elements may be cooled by the top of the electrode holder and/or the floor plate. The electrode holder and the floor plate have a coolant flowing through them.

The sealing elements are thus subjected to a lower level of thermal stress. Reduced thermal stress on the sealing elements results in longer service time/improved durability of the seal.

In one embodiment the top of the electrode holder may have an overlap c relative to the insulating ring. This provides further thermal and mechanical protection. The insulating ring is shaded from heat radiation and is subjected to lower levels of stress. The thermal stress on the sealing elements is also reduced.

There is an overlap present when the external diameter of the electrode holder D_E is larger than the external diameter of the insulating ring D_R.

The overlap c may be up to eight times the height of the insulating ring. Particular preference is given to an overlap of up to four times the height of the insulating ring. The grooves for receiving the sealing elements may be disposed both in the insulating rings and in the floor plate and/or in the top of the electrode holder but at least one groove is disposed in the electrode holder or floor plate.

The inventors have identified that an implementation known from the prior art, where both grooves for receiving the sealing elements are disposed in the insulating ring, is disadvantageous. The service time of the sealing elements is markedly higher when at least one groove is disposed not in the insulating ring but either in the electrode holder or in the floor plate. This is due to the electrode holder and floor plate being coolable which significantly reduces the thermal stress on the sealing elements even in large reactors and at high deposition temperatures.

The grooves are preferably disposed at a distance a from the electrode feedthrough of 10-40% of the total width b of the insulating ring (internal diameter of the insulating ring). The sealing elements are thus sufficiently far away from the side of the insulating ring that faces the reactor. This is advantageous in terms of the thermal stress on the sealing elements.

In a further embodiment the grooves may also be disposed at the same position (distance a from the electrode feedthrough of 10-40% of the total width b of the insulating ring) in the floor plate and in the top of the electrode holder. In this case the insulating ring has no grooves.

The sealing elements secured in the grooves in the electrode holder or floor plate are preferably cooled by the cooling medium in the floor plate and in the electrode holder. The cooling results in the sealing elements attaining a markedly lower temperature than the insulating ring.

The side of the insulating ring facing the reactor interior has a surface temperature of up to 600° C.

Since all parts, in particular the insulating ring, come into contact with the reaction atmosphere said parts must additionally show chemical resistance in an HCl/chlorosilane atmosphere.

A low thermal conductivity of the insulating ring facilitates the low thermal stress on the sealing elements. On the other hand low thermal conductivity of the insulating ring increases the surface temperature thereof on the reactor side. The surface temperature must not become high enough for electrically conductive silicon-containing deposits to be deposited on the insulating rings. Choosing a material having a suitable specific thermal conductivity for the insulating body is of great importance for troublefree functioning of this body.

The internal sealing elements are better protected against thermal influences from the reaction space (hot reaction gas, heat radiation) compared to a gasket or other forms of seal.

Compared to a sealing and insulating ring composed of one part, the material properties in constructions composed of more than one part may be better configured for the respective requirements of the sealing function and the insulating function.

The insulating ring need not have any sealing material properties.

The specific thermal conductivity at room temperature of the insulating ring is in the range from 1-200 W/mK, preferably 1-50 W/mK, and most preferably 1-5 W/mK.

The specific electrical resistance of the insulating ring at room temperature is greater than $10^9$ Ωcm, preferably greater than $10^{11}$ Ωcm, and most preferably greater than $10^{13}$ Ωcm.

To compensate for unevenness in the contact surfaces of the floor plate and the top of the electrode holder the insulating ring should have a minimum flexural strength. The flexural strength of the insulating ring should be greater than 120 MPa, preferably greater than 200 MPa, and most preferably greater than 500 MPa (determined according to DIN EN 843 for ceramic materials).

Suitable materials for the insulating ring thus include: aluminum oxide ($Al_2O_3$); silicon nitride ($Si_3N_4$); boron nitride (BN); zirconium oxide ($ZrO_2$), zirconium oxide stabilized with yttrium oxide ($ZrO_2$—$Y_2O_3$), with magnesium oxide ($ZrO_2$—MgO) or with calcium oxide ($ZrO_2$—CaO).

Particular preference is given to the use of zirconium oxide stabilized with yttrium oxide. This material showed the best thermal stability and dimensional stability. This material moreover has a very high flexural strength (>1000 MPa at 20° C.) due to the addition of yttrium oxide.

The sealing elements should withstand a sustained use temperature of 300-500° C. These elements should moreover be stable toward an HCl/chlorosilane atmosphere at 300-500° C.

The sealing elements may have either a curved surface or a flat surface. For a flat surface the sealing elements stand proud of the groove in the uncompressed state.

In the compressed state the top of the electrode holder is tightened against the floor plate via the insulating ring until locked in position. The sealing elements are confined in the groove and no longer stand proud of the groove. The sealing elements are thus subject to a force bypass.

It is preferable when the sealing elements are O-rings made of an elastomeric material of construction. Examples of suitable sealing elements are O-rings made of fluoroelastomers (FPM, according to ISO 1629), perfluoroelastomers (FFKM, ASTM D-1418) and silicone elastomers (MVQ, ISO 1629).

A further embodiment concerns seals made of graphite. It is preferable when the sealing elements made of graphite are graphite cords made of braided graphite fibers or are graphite foil rings. The use of graphite foil rings is particularly preferred. A graphite foil ring is composed of a plurality of compressed graphite layers. These sealing elements made of graphite have a sustained use temperature of up to 600° C. For the sealing elements made of graphite low compression forces are sufficient since the sealing area is very small. The sealing area is determined by the dimensions of the groove. The sealing area is preferably between 600 and 3000 $mm^2$, more preferably between 600 and 2000 $mm^2$ and most particularly preferably between 600 and 1500 $mm^2$. The insulating ring is therefore subject to only a low level of mechanical stress which prevents fracture of the insulating rings.

A further embodiment concerns seals made of metal. The sealing elements made of metal are preferably metallic annular spring seals. Owing to the small sealing areas of the metallic sealing elements a low compression force is sufficient to achieve sealing here as well. For the metal sealing elements a low compression force is to be understood as meaning a compression force of 60-300 N/mm of seal circumference, preferably 60-200 N/mm of seal circumference, particularly preferably 60-160 N/mm of seal circumference.

The metallic seals preferably have one of the following shapes:
- closed O-ring which is hollow on the inside (hollow metal O-ring);
- open metal profiles, for example C-shaped, U-shaped, E-shaped or any other desired profiles having a spring action, for example corrugated metal sealing rings;
- open metal profiles which are optionally spring supported, for example a C-ring with an additional internal coil spring.

A C-ring is a hollow O-ring with an open inner surface or outer surface.

To increase chemical resistance and to increase the sealing action the metallic sealing elements may be coated with ductile metals, for example with silver, gold, copper, nickel or with another ductile and HCl/chlorosilane atmosphere-stable metal.

The flowability of these ductile coating materials markedly increases the sealing action of the metallic sealing elements. These sealing elements made of metal have a sustained use temperature of up to 850° C.

The term ductile coating materials is to be understood as meaning metals where the grain boundaries and dislocations move/flow under mechanical stress even at an elongation less than the elongation at break. This flowing under the stress of an application of force, as is present during compression, compensates for unevenness in the sealing surfaces. This achieves improved sealing.

Particular preference is given to using a silver-coated metal C-ring with or without an internal coil spring.

However, large temperature changes at the metallic sealing elements, for example during charging and discharging of the batches, may result in mechanical damage at the sealing surface of the sealing elements due to thermal elongation of the sealing elements.

A further embodiment concerns a seal composed of 2 materials of construction, a flexible material of construction, for example a metal band joined into a ring and having at least one kink or bend which ensures a resilient force upon compression, and a filler material.

The sealing body is composed of a plurality of metal bands joined into rings and having different diameters, the bands being arranged one inside the other.

Disposed between the individual rings is a filler material, for example graphite or PTFE which provides the sealing action.

It is preferable when a spiral seal is employed. This is a metal band wound up in a plurality of layers and having at least one kink or bend. The filler material is disposed between the individual layers. The filler material achieves sealing on compression. The kinked metal band provides a resilient force and ensures the flexibility of the seal.

Preferred metals are stainless steels, Hastelloy, Inconel and nickel.

Hastelloy is the trademark for a nickel-based alloy from Haynes International, Inc.

Inconel is a trademark of Special Metals Corporation for a range of corrosion-resistant nickel-based alloys.

The preferred filler material is graphite.

The features cited in connection with the abovedescribed embodiments of the process according to the invention may be correspondingly applied to the device according to the invention. Conversely, the features cited in connection with the above-described embodiments of the device according to the invention may be correspondingly applied to the process according to the invention. These and other features of the embodiments according to the invention are elucidated in the description of the figures and in the claims. The individual features may be implemented either separately or in combination as embodiments of the invention. Said features may further describe advantageous implementations eligible for protection in their own right.

The invention is also elucidated hereinbelow with reference to FIGS. 1 to 9.

LIST OF REFERENCE NUMERALS USED 1 electrode holder
2 insulating ring
3 floor plate
4 sealing element
5 floor plate cooling means
6 electrode holder cooling inlet
7 electrode holder cooling means
8 insulating sheath
9 groove for sealing element
10 metal band
11 filler material
a groove distance from internal diameter
b total width
h insulating ring height
c overlap
D_E electrode holder external diameter
D_R insulating ring external diameter Disposed between the electrode holder 1 and the floor plate 3 are the insulating ring 2 and the sealing elements 4.

The floor plate 3 is provided with a perforation which is lined with an insulating sheath 8 and which has an electrode holder 1 which feeds through it and is fitted into it.

The floor plate 3 and the electrode holder 1 are cooled by cooling means 5 and 7.

6 shows the inlet for the cooling means 7 for the electrode holder 1.

Sealing is effected by sealing elements 4.

A first sealing element 4 is disposed in a groove in the electrode holder 1.

A second sealing element 4 is disposed in a groove in the floor plate 3.

The external diameter D_E of the electrode holder 1 may be flush with the external diameter D_R of the insulating ring 2 or it may be overlapping said external diameter D_R. It is preferable when the electrode holder is overlapping.

FIG. 1 shows an embodiment without an overlap.

Figure 2:
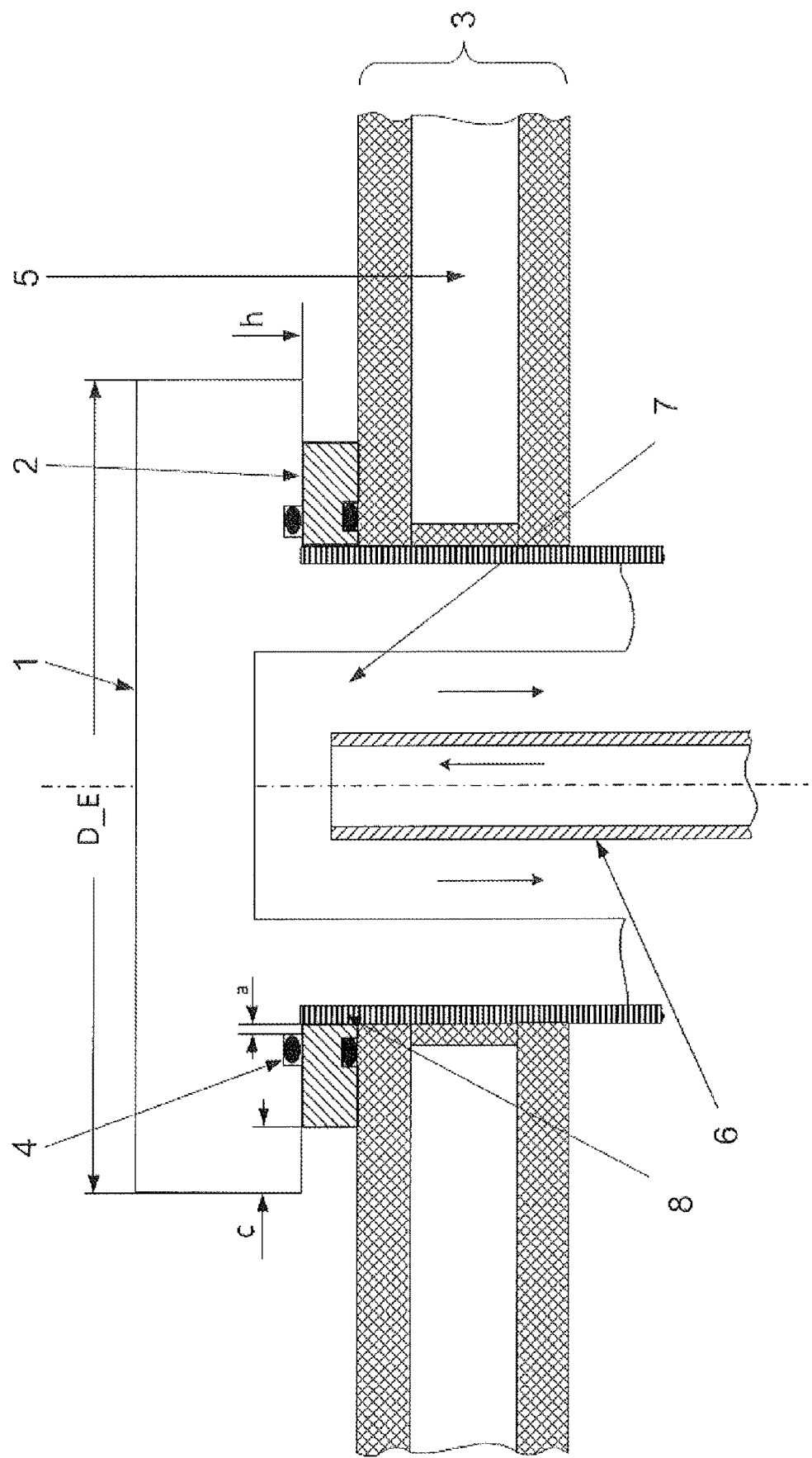
FIG. 2 shows a schematic diagram of a fitted insulating ring with an upper groove with a sealing element in the electrode holder and a groove with a sealing element in the insulating ring and with an overlap of the top of the electrode holder.
Figure 4:
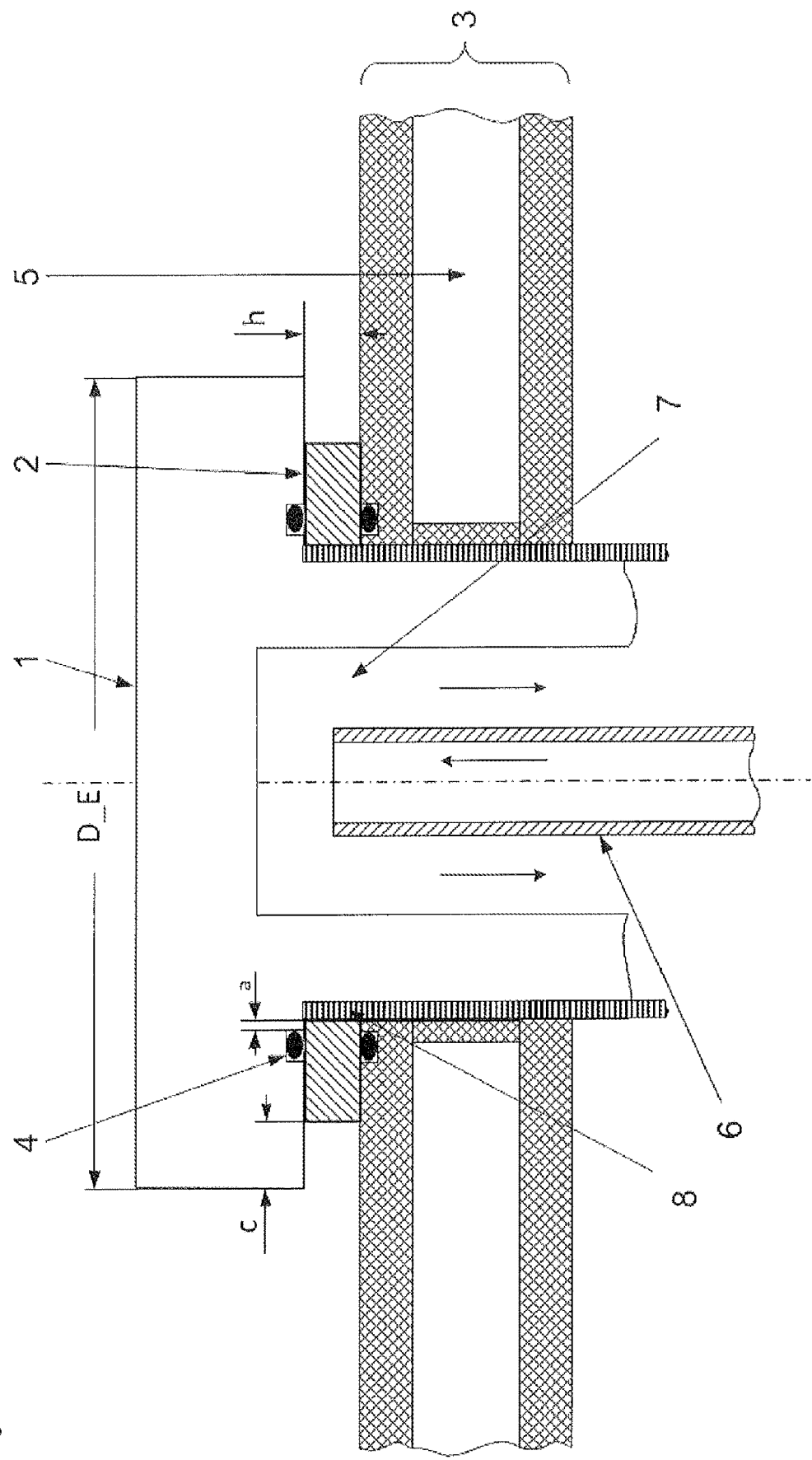
FIG. 4 shows a schematic diagram of a fitted insulating ring with a lower groove in the floor plate and an upper groove in the top of the electrode holder and with an overlap of the top of the electrode holder.

FIGS. 2 and 4 each show an embodiment with an overlap c.

Thus to provide further thermal and mechanical protection the top of the electrode holder 1 may project over the outer contour of the insulating ring 2. The overlap c should equal 0-8*h where h is the height of the insulating ring 2. An overlap of 0-4*h is particularly preferred.

FIG. 2 shows an embodiment where the electrode holder 1 and the insulating ring 2 each comprise a groove for receiving a sealing element 4.

Figure 3:
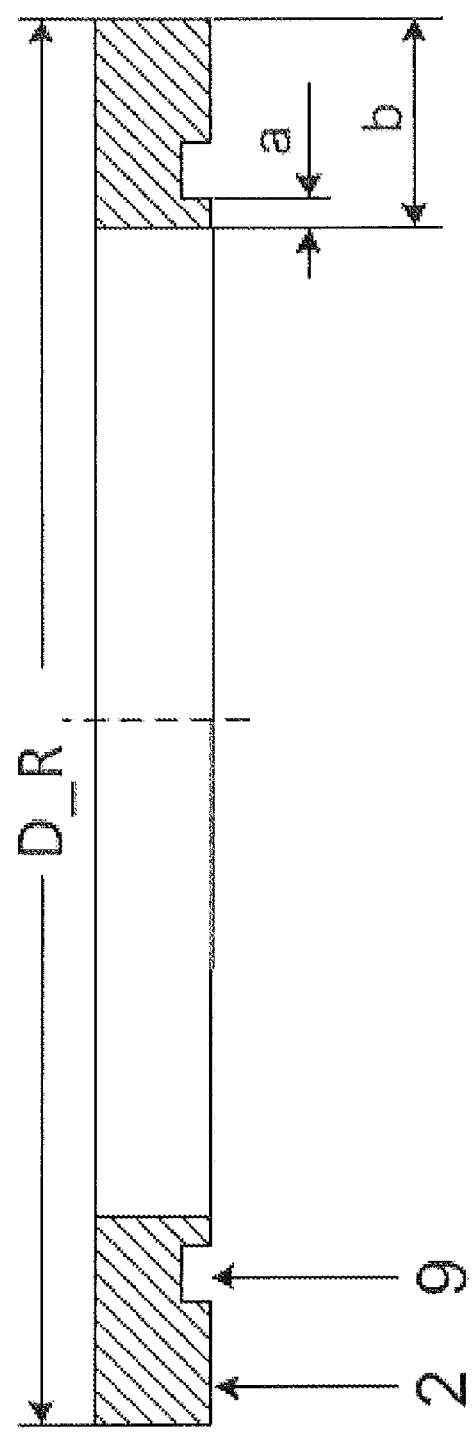
FIG. 3 shows a schematic diagram of an insulating ring with a groove on the underside.

The grooves 9 in the insulating ring 2 are disposed at a distance a from the electrode feedthrough of 10-40% of the total width b of the insulating ring, cf. FIG. 3. Also disposed at the same radial distance from the electrode feedthrough are the grooves in floor plate 3 or electrode holder 1.

The sealing elements 4 are thus sufficiently far away from the side of the insulating ring 2 that faces the reactor. This is advantageous since the thermal stress on the sealing elements 4 is therefore low. The sealing elements 4 are thus particularly effectively cooled by the cooling medium in the floor plate 2, the top of the electrode holder 1 and the feedthrough of the electrode through the floor plate 3. Owing to the effective cooling the sealing elements 4 can transfer heat energy to the cooling medium and are thus not subjected to thermal damage.

FIG. 4 shows a schematic diagram of a fitted insulating ring 2 with the grooves in the floor plate 3 and in the top of the electrode holder 1 and with an overlap of the top of the electrode holder 1. An embodiment with an overlap c is concerned.

Here the grooves for securing the sealing elements 4 are disposed not in the insulating ring 2 but rather in electrode holder 1 and floor plate 3.

Just as in FIG. 2 these grooves are disposed preferably at a distance a from the electrode feedthrough of 10-40% of the total width b of the insulating ring 2.

The sealing elements 4 are thus disposed at the same distance from the recess in the floor plate as the sealing elements of FIG. 2, though they are installed not in grooves in the insulating ring 2 but rather in grooves in electrode holder 1 and floor plate 3.

FIG. 5 shows a schematic representation of an insulating ring without a groove. Such an insulating ring is employed in the implementation according to FIG. 4.

FIG. 6 shows a cross-section through a metallic sealing element having a C-profile.

Figure 7:
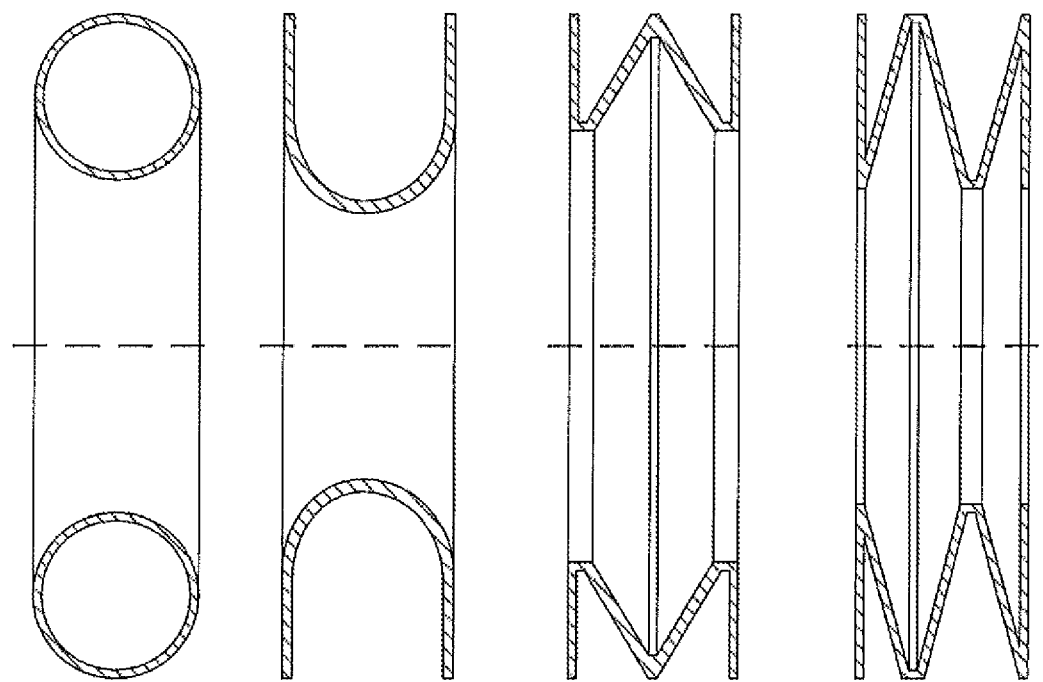
FIG. 7 shows cross-sections through further implementations of sealing elements made of metal.

FIG. 7 shows cross-sections through further implementations of sealing elements made of metal, O-profile, U-profile, E-profile, profile with spring action.

An E-ring is a double-folded double U-ring.

Figure 8:
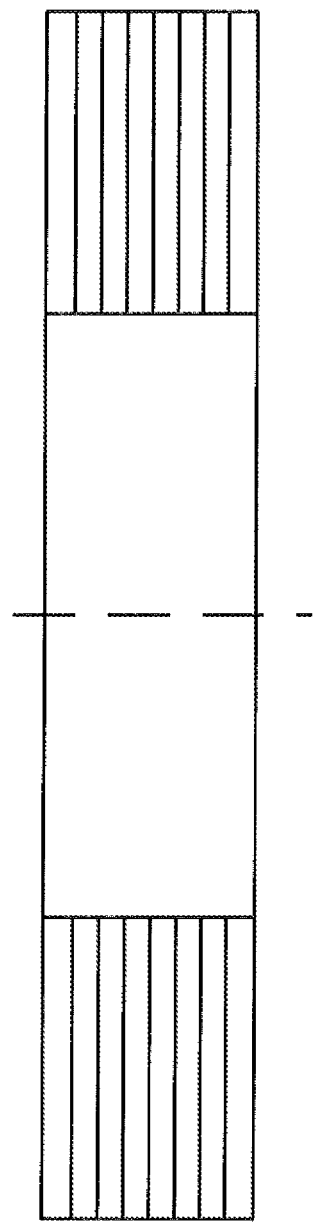
FIG. 8 shows a cross-section through a graphite foil ring composed of a plurality of compressed individual foils.

FIG. 8 shows a cross-section through a graphite foil ring composed of a plurality of compressed individual foils.

Figure 9:
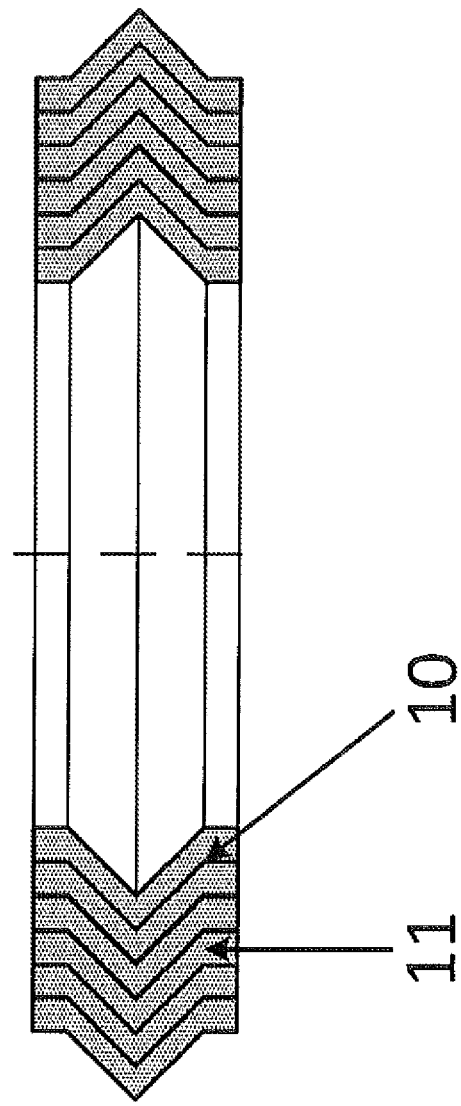
FIG. 9 shows a cross-section through a spiral seal.

FIG. 9 shows a cross-section through a spiral seal composed of a wound-up metal band 10 with a plurality of windings and a filler material 11 between the individual layers of the winding.

EXAMPLES

Polycrystalline silicon rods having a diameter between 160 and 230 mm were deposited n a Siemens deposition reactor.

A plurality of implementations of insulating rings and sealing elements were tested in the course thereof. The results of these tests are elucidated hereinbelow using selected examples and comparative examples.

The respective deposition process parameters were identical for all of the experiments. The deposition temperature over the course of the batch was between 1000° C. and 1100° C. During the deposition process a feed composed of one or more chlorine-containing silane compounds of formula $SiH_nCl_{4-n}$ (where n=0 to 4) and hydrogen as carrier gas was added.

The experiments differed solely in the implementation of the insulating rings and the sealing elements.

For comparison a PTFE insulating ring which simultaneously assumes the sealing and insulating functions was initially investigated. This ring thus does not provide for separation of functions via an insulating ring and additional sealing elements.

Also tested were insulating rings made of zirconium oxide in conjunction with metallic sealing elements. Sealing elements made of graphite or of elastomeric materials of construction such as perfluoroelastomers yield comparable results.

By way of comparison an implementation was investigated where the sealing elements are secured in grooves of the zirconium oxide ring.

It was found that the advantageous implementations had at least one sealing element secured either in a groove in the floor plate or in a groove in the electrode holder. An overlap of the electrode holder relative to the insulating ring can further reduce the thermal stress on the sealing elements.

Comparative Example 1

CVD reactor comprising insulating ring made of PTFE:

In this prior art embodiment the insulating ring made of PTFE assumes the sealing function and the insulating function. Owing to the low dimensional stability the height of the insulating ring is limited to 8 mm when new.

Because of the high thermal stress during operation and the necessary pressing force of 35 to 40 kN to ensure the sealing function of the insulating ring the height of the insulating ring was reduced to a minimum value of 4 mm within 3 months.

The service time is thus limited to 3 months.

Owing to the thermal stress brought about by the hot reaction gas both the sealing of the floor plate and the electrical insulation were no longer intact due to thermal cracking and settling of the sealing body. Thus after this period costly and inconvenient replacement of all insulating rings was required. Repair operations resulted in a considerable loss of capacity.

Comparative Example 2

CVD reactor comprising insulating ring made of zirconium oxide ($ZrO_2$):

In this implementation the sealing function and the insulation function are divided over two components. The insulating ring made of $ZrO_2$ is employed to achieve electrical insulation between the electrode holder and the floor plate. The insulating ring has a height of 8 mm when new. The sealing function is assumed by respective silver-coated metal C-rings toward the top of the electrode holder and toward the floor plate, the two metal C-rings being secured in an upper groove and in a lower groove of the insulating ring.

Owing to the use of the C-rings a compression force of 65 N/mm of seal circumference is required. $ZrO_2$ exhibits no settling behavior as a ceramic material component. The low contact pressures ensure that the insulating ring made of ceramic material is not fractured.

Owing to the very high thermal stability and the markedly higher specific thermal conductivity compared to PTFE the side of the insulating ring facing the reactor was not thermally weakened after an operating time of 12 months.

However, the C-rings showed surface mechanical damage at the sealing surfaces caused by thermal expansion due to large temperature changes of the sealing bodies during startup and shutdown of the reactor for the individual batches in batch operation, the upper C-ring in particular being severely damaged. It was found that the sealing elements need to be replaced at the latest after an operating time of 9 months.

The service time thus increased relative to comparative example 1 to a maximum of 9 months.

Example 1

CVD reactor comprising insulating ring made of zirconium oxide ($ZrO_2$):

In this implementation the sealing function and the insulation function are divided over two components. The insulating ring made of $ZrO_2$ is employed to achieve electrical insulation between the electrode holder and the floor plate. The insulating ring has a height of 8 mm when new. The sealing function is assumed by respective silver-coated metal C-rings toward the top of the electrode holder and toward the floor plate, one metal C-ring being secured in a groove in the electrode holder and one metal C-ring being secured in a groove in the insulating ring. The overlap c was twice the height of the insulating ring, i.e. 16 mm.

Owing to the use of the C-rings a compression force of 65 N/mm of seal circumference is required. $ZrO_2$ exhibits no settling behavior as a ceramic material component. The low contact pressures ensure that the insulating ring made of ceramic material is not fractured.

Owing to the very high thermal stability and the markedly higher specific thermal conductivity compared to PTFE the side of the insulating ring facing the reactor was not thermally weakened even after an operating time of 12 months. It was found that the shading of heat radiation resulting from the overlap c contributes to this.

The C-rings too showed no thermal damage and barely any mechanical damage after this period and the upper C-ring secured in a groove in the cooled electrode holder was not thermally or mechanically weakened.

The service time thus increased to at least 12 months.

Example 2

In this implementation the sealing function and the insulation function are divided over two components. The insulating ring made of $ZrO_2$ is employed to achieve electrical insulation between the electrode holder and the floor plate. The insulating ring has a height of 8 mm when new. The sealing function is assumed by respective silver-coated metal C-rings toward the top of the electrode holder and toward the floor plate, one metal C-ring being secured in a groove in the electrode holder and one metal C-ring being secured in a groove in the floor plate. The electrode holder had no overlap c relative to the insulating ring.

Owing to the very high thermal stability and the markedly higher specific thermal conductivity compared to PTFE the side of the insulating ring facing the reactor was not thermally weakened after an operating time of 12 months.

Owing to the cooling of the electrode holder and the floor plate the metal C-rings were not thermally or mechanically weakened either.

The service time thus increased to at least 12 months.

The description hereinabove of illustrative embodiments is to be understood as being exemplary. The disclosure made thereby enables a person skilled in the art to understand the present invention and the advantages associated therewith and also encompasses alterations and modifications to the described structures and processes obvious to a person skilled in the art. All such alterations and modifications and also equivalents shall therefore be covered by the scope of protection of the claims.

The invention claimed is:

1. A device for insulating and sealing electrode holders in CVD reactors, comprising an electrode which is suitable for accommodating a filament rod and is disposed on an electrode holder made of an electrically conductive material and mounted in a recess in a floor plate, the electrode holder and floor plate having coolant flowing through them, wherein provided between the electrode holder and the floor plate is an electrically insulating ring made of a material of construction having a specific thermal conductivity at room temperature of 1-200 W/mK, a sustained use temperature of no less than 400° C. and a specific electrical resistance at room temperature of more than $10^9$ Ωcm, wherein at least two ring-shaped sealing elements for sealing between the electrode holder and the floor plate are provided, wherein the electrically insulating ring or the electrode holder or the floor plate comprises grooves in which the sealing elements are secured, wherein at least one of the sealing elements is secured in a groove disposed in the electrode holder or in the floor plate and arranged above or below the electrically insulating ring.

2. The device of claim 1, wherein the material of construction of the electrically insulating ring is selected from at least one material from the group consisting of aluminum oxide, silicon nitride, boron nitride, zirconium oxide, zirconium oxide stabilized with yttrium ox-ide, with magnesium oxide or with calcium oxide.

3. The device of claim 1, wherein the sealing elements are elastomer O-rings.

4. The device of claim 3, wherein the elastomer comprises a fluoroelastomer, a perfluoroelastomer or a silicone elastomers.

5. The device of claim 1, wherein the sealing elements comprise graphite foil rings.

6. The device of claim 1, wherein the sealing elements comprise metallic O-rings, or metallic seals having an open profile and a spring action.

7. The device of claim 6, wherein the metallic seals having an open profile comprise an internal coil spring.

8. The device of claim 6, wherein the metallic sealing elements are coated with a ductile metal.

9. The device of claim 8, wherein the metallic seal has a C-profile and is coated with silver.

10. The device of claim 1, wherein a sealing element comprises a plurality of metal bands joined into rings and having different diameters, wherein the ring-shaped metal bands are arranged one inside the other and each have at least one kink or bend, wherein a filler material is disposed between the individual metal bands.

11. The device of claim 10, wherein a sealing element comprises flexible metal bands of stainless steel, nickel or a nickel-based alloy.

12. The device of claim 10, wherein the filler material comprises graphite.

13. The device of claim 1, wherein a sealing element comprises metal bands wound up in the shape of a spiral to form a spiral seal.

14. The device of claim 1, wherein a radial overlap c of the electrode holder relative to the electrically insulating ring is between zero and not more than eight times the height h of the electrically insulating ring.

15. The device of claim 1, wherein the grooves for receiving the sealing elements in the electrically insulating ring or in the floor plate or in the electrode holder are spaced apart from the recess in the floor plate such that the distance from the recess is 10-40% of the total width of the electrically insulating ring.

16. A process for producing polycrystalline silicon, comprising introducing a reaction gas comprising a silicon-comprising component and hydrogen into a CVD reactor comprising at least one filament rod which is disposed on a device of claim 1 and which is supplied with current via the electrode and which is thus heated by direct passage of current to a temperature at which polycrystalline silicon is deposited on the filament rod.

* * * * *